(12) United States Patent
Yin (10) Patent No.: US 12,167,581 B2
(45) Date of Patent: Dec. 10, 2024

(54) FLEXIBLE DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Hang Yin, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 682 days.

(21) Appl. No.: 17/297,348

(22) PCT Filed: Mar. 31, 2021

(86) PCT No.: PCT/CN2021/084696
§ 371 (c)(1),
(2) Date: May 26, 2021

(87) PCT Pub. No.: WO2022/183560
PCT Pub. Date: Sep. 9, 2022

(65) Prior Publication Data
US 2023/0354565 A1    Nov. 2, 2023

(30) Foreign Application Priority Data
Mar. 1, 2021 (CN) .......................... 202110225840.8

(51) Int. Cl.
H05K 7/20    (2006.01)
B32B 37/12   (2006.01)
(Continued)

(52) U.S. Cl.
CPC ..... H05K 7/20963 (2013.01); B32B 37/1292 (2013.01); B32B 37/22 (2013.01); B32B 38/0004 (2013.01)

(58) Field of Classification Search
CPC .......... H05K 7/20963; H05K 7/20954; H05K 7/20972; B32B 37/1292; B32B 37/22; B32B 38/0004
See application file for complete search history.

(56) References Cited

U.S. PATENT DOCUMENTS 9,620,742 B2 * 4/2017 Kim .................... H10K 59/8794
9,961,809 B1 * 5/2018 Yoon .................. H05K 7/20963
(Continued)

FOREIGN PATENT DOCUMENTS

CN    101740504 A    6/2010
CN    108986670 A    12/2018
(Continued)

OTHER PUBLICATIONS

CN-111599280-A Translation.*
TW-1265608-B Translation.*

*Primary Examiner* — Jacob R Crum
*Assistant Examiner* — Matthew Sinclair Muir (57) ABSTRACT

A flexible display device and a manufacturing method thereof are provided. The flexible display device includes a flexible display panel, a composite support assembly, and a first adhesive layer. The composite support assembly is disposed between a first plane section and a second plane section of the flexible display panel. A surface of the first adhesive layer close to the composite support assembly is connected to the composite support assembly. The first adhesive layer is provided with a protrusion extending into the composite support assembly.

17 Claims, 2 Drawing Sheets

(51) Int. Cl.
    *B32B 37/22*    (2006.01)
    *B32B 38/00*    (2006.01)

(56) References Cited

U.S. PATENT DOCUMENTS

| | | | |
|---|---|---|---|
| 2003/0025118 | A1 | 2/2003 | Yamazaki |
| 2014/0192495 | A1 | 7/2014 | Yajima |
| 2019/0305073 | A1* | 10/2019 | Chen .................... H10K 59/121 |
| 2019/0334101 | A1* | 10/2019 | Shang ................... H10K 71/00 |
| 2019/0385491 | A1* | 12/2019 | Xu .......................... G09F 9/301 |
| 2020/0365789 | A1* | 11/2020 | Lin ....................... H01L 33/644 |
| 2021/0126209 | A1* | 4/2021 | Lee ...................... H10K 59/123 |
| 2021/0226075 | A1* | 7/2021 | Huang .................. H01L 31/052 |

FOREIGN PATENT DOCUMENTS

| | | | | |
|---|---|---|---|---|
| CN | 110491914 | A | | 11/2019 |
| CN | 110767098 | A | | 2/2020 |
| CN | 111524939 | A | | 8/2020 |
| CN | 111564677 | A | | 8/2020 |
| CN | 111584440 | A | | 8/2020 |
| CN | 111599280 | A | * 8/2020 | ............. G09F 9/301 |
| CN | 112289186 | A | | 1/2021 |
| CN | 112396971 | A | | 2/2021 |
| TW | 200516736 | A | | 5/2005 |
| TW | I265608 | B | * 11/2006 | |

* cited by examiner

FLEXIBLE DISPLAY DEVICE AND MANUFACTURING METHOD THEREOF

FIELD OF DISCLOSURE

The present disclosure relates to the field of flexible display technologies, and in particular to a flexible display device and a manufacturing method thereof.

BACKGROUND

An existing flexible display device needs to bend its bending portion so that a backplate is bent to a non-display side of the display panel. A composite support assembly is usually disposed between two ends of the bent backplate to achieve a purpose of supporting a thickness of the bent backplate. The existing composite support assembly includes a metal heat dispersion plate. An adhesive layer is disposed between the metal heat dispersion plate and the backplate to ensure stable adhesion between the metal heat dispersion plate and the backplate. However, in order to protect a surface of the metal heat dispersion plate from being scratched or oxidized, the surface of the metal heat dispersion plate is coated with a layer of silicone oil in actual production. The silicone oil on the surface of the metal heat dispersion plate will cause an adhesive force between it and the adhesive layer to decrease, so that the composite support assembly is offset or separated from the backplane under an external force, thereby reducing a production yield of the flexible display device.

SUMMARY OF DISCLOSURE

Embodiments of the present disclosure provide a flexible display device and a manufacturing method thereof to solve a technical problem of insufficient adhesive force between a composite support assembly and an adhesive layer.

An embodiment of the present disclosure provides a flexible display device, including: a flexible display panel, a composite support assembly, and a first adhesive layer. The flexible display panel is bent to form a first plane section, a bending section, and a second plane section, and both ends of the bending section are connected to the first plane section and the second plane section, respectively. The composite support assembly is disposed between the first plane section and the second plane section. A surface of the first adhesive layer close to the composite support assembly is connected to the composite support assembly, and the first adhesive layer is provided with a protrusion extending into the composite support assembly.

Alternatively, in some embodiments, the flexible display device further includes a second adhesive layer. The second adhesive layer is adhered and fixed to a surface of the first adhesive layer away from the composite support assembly.

Alternatively, in some embodiments, the composite support assembly includes a heat dispersion plate, the heat dispersion plate is provided with a recess, and the protrusion extends into the recess.

Alternatively, in some embodiments, a side wall of the recess is inclined, and an opening area of the recess is smaller than a bottom area of the recess.

Alternatively, in some embodiments, the composite support assembly includes a heat dispersion plate, the heat dispersion plate is provided with an opening, and the protrusion extends through the heat dispersion plate via the opening.

Alternatively, in some embodiments, the composite support assembly further includes a buffer layer with a pore structure, the protrusion extends from the opening into the pore structure of the buffer layer, and the first adhesive layer is engaged with the buffer layer.

Alternatively, in some embodiments, the composite support assembly further includes a buffer layer, a surface of the buffer layer close to the heat dispersion plate is provided with a blind hole corresponding to the opening, and the protrusion extends through the opening to the blind hole.

Alternatively, in some embodiments, an orthographic projection of the blind hole on the heat dispersion plate completely covers the opening, and an area of the orthographic projection of the blind hole on the heat dispersion plate is larger than or equal to an area of the opening.

Alternatively, in some embodiments, a depth of the blind hole is less than half of a thickness of the buffer layer.

Alternatively, in some embodiments, a thickness of a part of the first adhesive layer outside the heat dispersion plate ranges from 50 micrometers to 150 micrometers.

Alternatively, in some embodiments, the opening and the blind hole are square, a side length of the opening ranges from 1 mm to 2 mm, and a side length of the blind hole ranges from 2 mm to 3 mm.

Alternatively, in some embodiments, material of the buffer layer includes a foam with the pore structure.

Alternatively, in some embodiments, the composite support assembly further includes a buffer layer, a blind hole is formed on a surface of the buffer layer close to the first adhesive layer, and the protrusion extends into the blind hole.

Alternatively, in some embodiments, a side wall of the blind hole is inclined, and an opening area of the blind hole close to the first adhesive layer is smaller than a bottom area of the blind hole away from the first adhesive layer.

Alternatively, in some embodiments, the first adhesive layer is in a liquid state with good fluidity when heated or before photocuring; and the first adhesive layer is in a solid state at a room temperature or after photocuring.

Alternatively, in some embodiments, the first adhesive layer is an ultraviolet (UV) adhesive or a Taffeta adhesive, and the second adhesive layer is a double-sided adhesive.

Alternatively, in some embodiments, the protrusion is engaged with the composite support assembly.

Alternatively, in some embodiments, the composite support assembly includes a heat dispersion plate, the heat dispersion plate is provided with an opening, the protrusion extends through the heat dispersion plate via the opening, and a side wall of the opening is inclined.

An embodiment of the present disclosure also provides a flexible display device, including: a flexible display panel, a composite support assembly, a first adhesive layer, and a second adhesive layer. The flexible display panel is bent to form a first plane section, a bending section, and a second plane section, and both ends of the bending section are connected to the first plane section and the second plane section, respectively. The composite support assembly is disposed between the first plane section and the second plane section. The composite support assembly includes a heat dispersion plate and a buffer layer, the heat dispersion plate is provided with an opening, a surface of the buffer layer close to the heat dispersion plate is provided with a blind hole corresponding to the opening, an orthographic projection of the blind hole on the heat dispersion plate completely covers the opening, and an area of the orthographic projection of the blind hole on the heat dispersion plate is larger than or equal to an area of the opening. The first adhesive layer is disposed on the heat dispersion plate, the first adhesive layer is formed with a protrusion that extends through and fills the opening and the blind hole, and the first adhesive layer is engaged with the composite support assembly through the protrusion. The second adhesive layer is adhered and fixed to a surface of the first adhesive layer away from the heat dispersion plate.

An embodiment of the present disclosure also provides a manufacturing method of the above-mentioned flexible display device, including:

B1, providing the heat dispersion plate and the buffer layer;

B2, forming a plurality of the openings on the heat dispersion plate of the composite support assembly, and forming a plurality of the blind holes on the buffer layer of the composite support assembly corresponding to the openings, where an orthographic projection of the blind holes on the heat dispersion plate completely covers the openings, and an area of the orthographic projection of the blind holes on the heat dispersion plate is larger than or equal to twice an area of the openings;

B3, assembling the heat dispersion plate and the buffer layer obtained in the step B2 with a grid adhesive to form the composite support assembly;

B4, filling the openings and the blind holes with a first adhesive layer material in a fluid state, and then coating with the first adhesive layer material in the fluid state until the first adhesive layer with a target thickness is formed on a surface of the heat dispersion plate;

B5, curing the first adhesive layer material to obtain the first adhesive layer with a plurality of the protrusions, where the protrusions extend into the openings and the blind holes; and a bonding force between the first adhesive layer and the heat dispersion plate includes an adhesive force between the first adhesive layer and the heat dispersion plate and a connection force of engaging the first adhesive layer with the composite support assembly;

B6, cutting the composite support assembly obtained in the step B5 into a size that matches the flexible display panel, and adhering the cut composite support assembly to a first backplane; and B7, adhering and fixing a surface of the composite support assembly away from the first backplane to a second backplane by using the second adhesive layer and the first adhesive layer, where the first adhesive layer is adhered and fixed to the heat dispersion plate, and an adhesive force between the first adhesive layer material and the heat dispersion plate is greater than an adhesive force between material of the second adhesive layer and the heat dispersion plate.

In the present disclosure, by forming the protrusion extending into the composite support assembly on the first adhesive layer, the protrusion increases the bonding force between the first adhesive layer and the composite support assembly. Thus, a stability of a connection between the composite support assembly and the second backplane is improved, a risk of peeling off the composite support assembly is reduced, and the problem of insufficient adhesion between the composite support assembly and the adhesive layer in the prior art is solved.

BRIEF DESCRIPTION OF DRAWINGS

In order to more clearly describe technical solutions in the embodiments of the present disclosure, the following will briefly introduce accompanying drawings that need to be used in the description of the embodiments. Apparently, the accompanying drawings in the following description are only some embodiments of the present disclosure. For those skilled in the art, without creative efforts, other drawings can be obtained based on these accompanying drawings.

DETAILED DESCRIPTION

The technical solutions in the embodiments of the present disclosure will be clearly and completely described below in conjunction with the accompanying drawings in the embodiments of the present disclosure. Apparently, the described embodiments are only a part of the embodiments of the present disclosure, rather than all of the embodiments. Based on the embodiments in the present disclosure, all other embodiments obtained by those skilled in the art without creative efforts are within a protection scope of the present disclosure.

Figure 1:
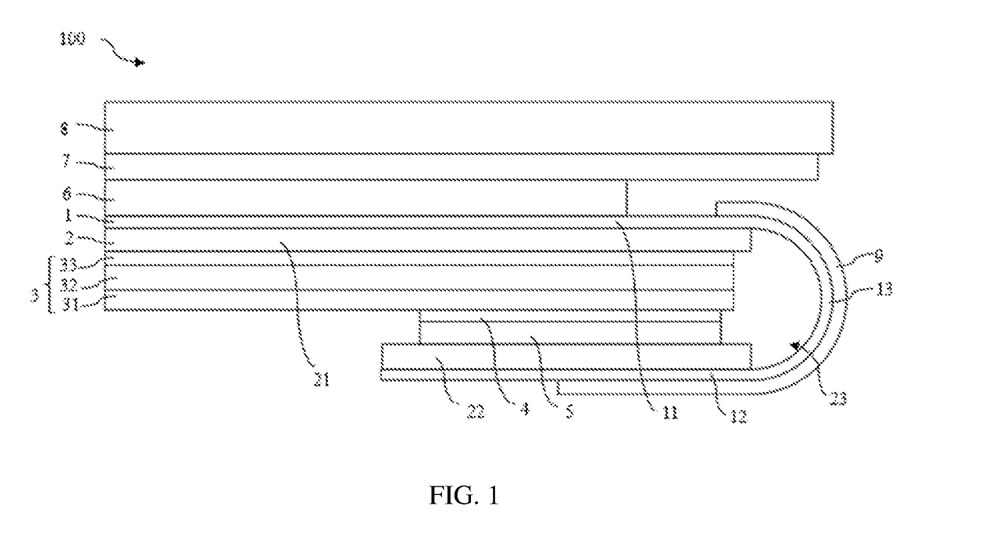
FIG. 1 is a schematic side view of a flexible display device of a first specific embodiment of the present disclosure.
Figure 2:
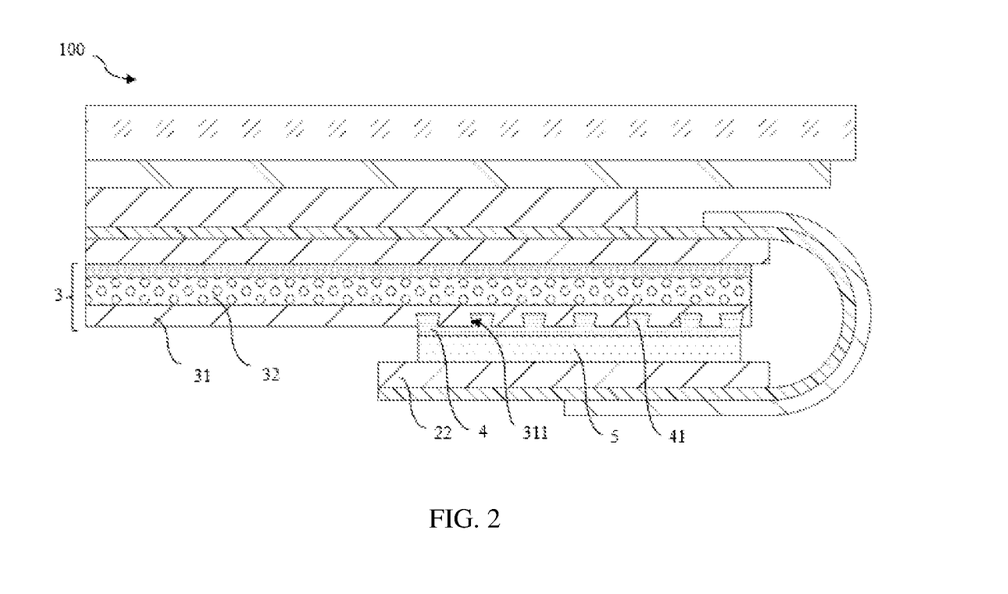
FIG. 2 is a cross-sectional view of the flexible display device in FIG. 1.

As shown in FIG. 1 and FIG. 2, the present disclosure provides a flexible display device 100 of a first specific embodiment, including: a flexible display panel 1, a backplate 2, a composite support assembly 3, a first adhesive layer 4, a second adhesive layer 5, a polarizer 6, an optical adhesive 7, a cover plate 8, and a protective layer 9.

The flexible display panel 1 includes a display area (not shown in the figures) configured to display an image. The display area is provided with pixels (not shown in the figures) and a driving circuit (not shown in the figures) configured to drive the pixels to display. In order to reduce a width of a bezel of the flexible display device 100 as much as possible, the flexible display panel 1 is bent at a preset position. As shown in FIG. 1, when the flexible display panel 1 is bent, the flexible display panel 1 can be divided into a first plane section 11, a second plane section 12, and a bending section 13 that are connected in sequence. The bending section 13 is arranged between the first plane section 11 and the second plane section 12. Both ends of the bending section 13 are connected to the first plane section 11 and the second plane section 12, respectively.

It can be understood that deformation degrees of the first plane section 11 and the second plane section 12 are less than a deformation degree of the bending section 13. The first plane section 11 and the second plane section 12 need not be provided with flat surfaces. In other embodiments, an entire of the flexible display panel 1 may be bent or wound. In other words, the bending section 13 is not limited to the bending section in the flexible display panel 1 as shown in the drawings. Any part of the flexible display panel 1 can be bent into at least one of the first plane section 11, the bending section 13, or the second plane section 12.

The backplate 2 includes a first backplane 21 and a second backplane 22. The first backplane 21 corresponds to the first plane section 11. The second backplane 22 corresponds to the second plane section 12. A recess 23 is formed between the first backplane 21 and the second backplane 22. The recess 23 corresponds to the bending section. The backplate 2 can be made of organic insulating materials such as polyimide (PI) and/or polyethylene terephthalate (PET) that can isolate water and oxygen.

The flexible display panel 1 is formed on the backplate 2. The first plane section 11 is disposed on the first backplane 21. The second plane section 12 is disposed on the second backplane 22. The bending section 13 and the recess 23 are disposed relative to each other. In this embodiment, the recess 23 extends through the backplate 2 along a thickness direction of the backplate 2 to form an opening that exposes flexible display panel 1, so as to increase flexibility of the flexible display panel 1 in the bending section 13 as much as possible.

The composite support assembly 3 is stacked between the first backplane 21 and the second backplane 22 after bending. The composite support assembly 3 is stacked between the first plane section 11 and the second plane section 12. The composite support assembly 3 includes a heat dispersion plate 31, a buffer layer 32, and a grid adhesive 33. The buffer layer 32 is disposed between the heat dispersion plate 31 and the grid adhesive 33. The heat dispersion plate 31 is mostly made of metal materials with better heat dissipation performance, such as copper and aluminum. The buffer layer 32 is mostly made of foam material with a pore structure. One side of the composite support assembly 3 is adhered and fixed on a surface of the first backplane 21 away from the first plane section 11 through the grid adhesive 33.

The first adhesive layer 4 is disposed on a surface of the heat dispersion plate 31 away from the grid adhesive 33. The first adhesive layer 4 is in a liquid state with good fluidity when heated or in a liquid state with good fluidity before photocuring. A first adhesive layer material in the liquid state can evenly cover the heat dispersion plate 31 by spraying, dripping, or direct coating. The first adhesive layer 4 is in a solid state at room temperature or in a solid state after photocuring. The first adhesive layer material in the solid state can be adhered and fixed to the surface of the heat dispersion plate 31. Commonly, the first adhesive layer 4 can be made of materials such as an ultraviolet (UV) adhesive or a Taffeta adhesive.

The second adhesive layer 5 is mostly made of a common double-sided adhesive. The second adhesive layer 5 is disposed between the first adhesive layer 4 and the second backplane 22, so that the composite support assembly 3 and the second backplane 22 are adhered and fixed to each other through the first adhesive layer 4 and the second adhesive layer 5. Specifically, a surface of the first adhesive layer 4 close to the composite support assembly 3 is adhered and fixed to the heat dispersion plate 31. A surface of the first adhesive layer 4 away from the composite support assembly 3 is adhered and fixed to the second adhesive layer 5. A surface of the second adhesive layer 5 away from the first adhesive layer 4 is adhered and fixed to the second backplane 22.

The polarizer 6 is disposed on the flexible display panel 1. The cover plate 8 is adhered and fixed to the polarizer 6 through the optical adhesive 7 to effectively protect an internal structure of the flexible display device.

The protective layer 9 is made of UV adhesive and configured to protect the bending section 13 of the flexible display panel 1 from damage by an external force. One end of the protective layer 9 extends to a surface of the first plane section 11, and another end extends to a surface of the second plane section 12.

Referring to FIG. 2, in this embodiment, the heat dispersion plate 31 is provided with a recess 311 in an area directly opposite to the first adhesive layer 4. The recess 311 is formed on the surface of the heat dispersion plate 31 close to the first adhesive layer 4.

The surface of the first adhesive layer 4 close to the heat dispersion plate 31 is formed with a protrusion 41 filling the recess 311 to increase a contact area between the first adhesive layer 4 and the heat dispersion plate 31, thereby further increasing an adhesive force between the first adhesive layer 4 and the heat dispersion plate 31.

In an actual production, the surface of the heat dispersion plate 31 is usually coated with silicone oil, which will reduce an adhesive force between the heat dispersion plate 31 and a common adhesive layer. In this embodiment, the first adhesive layer 4 is disposed between the heat dispersion plate 31 and the second adhesive layer 5. A bonding force between the first adhesive layer 4 and the composite support assembly 3 includes an adhesive force between the first adhesive layer 4 and the heat dispersion plate 31. Since the contact area between the first adhesive layer 4 and the heat dispersion plate 31 is increased by the construction 41, the bonding force between the first adhesive layer 4 and the composite support assembly 3 is greater than the adhesive force between the metal heat dispersion plate and the adhesive layer in the prior art. A stability of a connection between the composite support assembly 3 and the second backplane 22 can be increased by adhering and fixing the second adhesive layer 5 to the heat dispersion plate 31 through the first adhesive layer 4.

The first adhesive layer 4 can be made of material with a larger adhesive force between the heat dispersion plate 31 and the first adhesive layer 4, so that the adhesive force between the material of the first adhesive layer 4 and the heat dispersion plate 31 is greater than the adhesive force between the material of the second adhesive layer 5 and the heat dispersion plate 31. Furthermore, the first adhesive layer 4 and the second adhesive layer 5 are mostly made of organic materials, so that an adhesive force between the first adhesive layer 4 and the second adhesive layer 5 is much greater than the adhesive force between the metal heat dispersion plate and the adhesive layer in the prior art. The stability of the connection between the composite support assembly 3 and the second backplane 22 can also increase by adhering and fixing the second adhesive layer 5 to the heat dispersion plate 31 through the first adhesive layer 4.

In this embodiment, a side wall of the recess 311 can also be inclined to make an opening area of the recess 311 smaller than a bottom area. A cross-sectional shape of recess 311 is an inverted trapezoid. A cross-sectional shape of the protrusion 41 in the recess 311 is also an inverted trapezoid. This structure can not only increase the contact area between the first adhesive layer 4 and the heat dispersion plate 31, but also form an engaging structure between the cured first adhesive layer 4 and the heat dispersion plate 31 to realize an engaging connection between the first adhesive layer 4 and the composite support assembly 3. Also, the bonding force between the first adhesive layer 4 and the composite support assembly 3 includes the adhesive force between the first adhesive layer 4 and the heat dispersion plate 31 and a connection force of engaging the first adhesive layer 4 with the heat dispersion plate 31. Therefore, the inclined design of the sidewall of the recess 311 can enhance the bonding force between the first adhesive layer 4 and the heat dispersion plate 31, thereby improving the stability of the connection between the composite support assembly 3 and the second backplane 22, and reducing a risk of peeling off the composite support assembly 3.

It can be understood that the recess 311 may also continuously extend toward a direction where the buffer layer 32 is located, to form an opening that extends through the heat dispersion plate 31. The contact area between the first adhesive layer 4 and the heat dispersion plate 31 can be further increased. The adhesive force between the first adhesive layer 4 and the heat dispersion plate 31 is increased, thereby increasing the bonding force between the first adhesive layer 4 and the heat dispersion plate 31. It is ensured that the bonding force between the first adhesive layer 4 and the heat dispersion plate 31 is greater than the adhesive force between the adhesive layer and the heat dispersion plate in the prior art.

In some other embodiments of the present disclosure, a first adhesive layer material in a liquid state can continuously flow into the buffer layer 32 after filling the opening-shaped recess 311. The buffer layer 32 is mostly made of a foam material, which is a porous material with a plurality of pores of uneven size. The first adhesive layer 4 in the liquid state flowing into the buffer layer 32 through the recess 311 can further penetrate into the pores of the foam. When the protrusion 41 in the foam is cured in a subsequent manufacturing process, the engaging structure can be formed between the first adhesive layer 4 and the buffer layer 32. At this time, the bonding force between the first adhesive layer 4 and the composite support assembly 3 includes the adhesive force between the first adhesive layer 4 and the heat dispersion plate 31 and the connection force of engaging the first adhesive layer 4 with the buffer layer 32. Therefore, the design of the opening 312 can enhance the bonding force between the first adhesive layer 4 and the heat dispersion plate 31 to realize the engaging connection between the first adhesive layer 4 and the composite support assembly 3, thereby improving the stability of the connection between the composite support assembly 3 and the second backplane 22, and reducing the risk of peeling off the composite support assembly 3.

Figure 3:
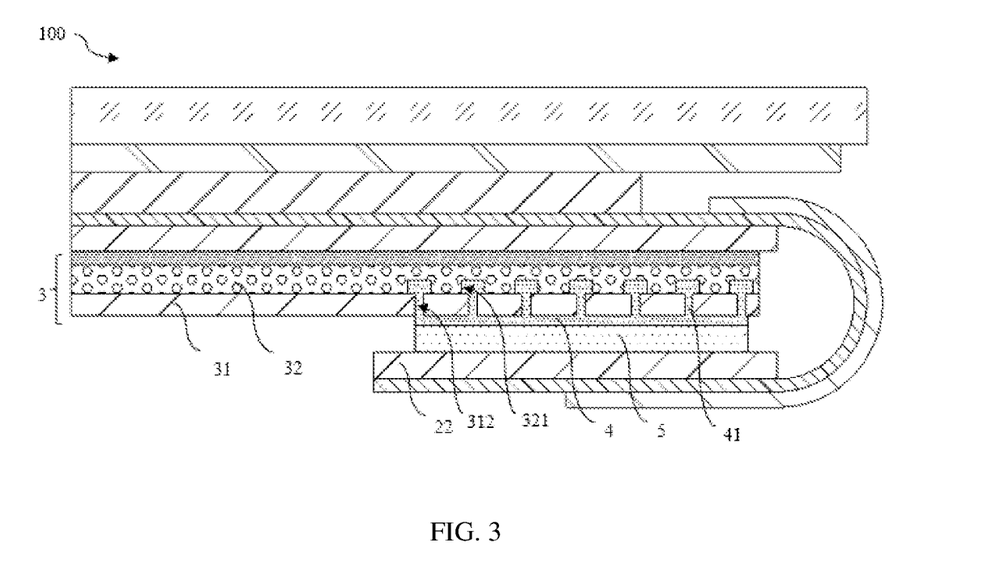
FIG. 3 is a schematic side view of a flexible display device of a second specific embodiment of the present disclosure.
Figure 4:
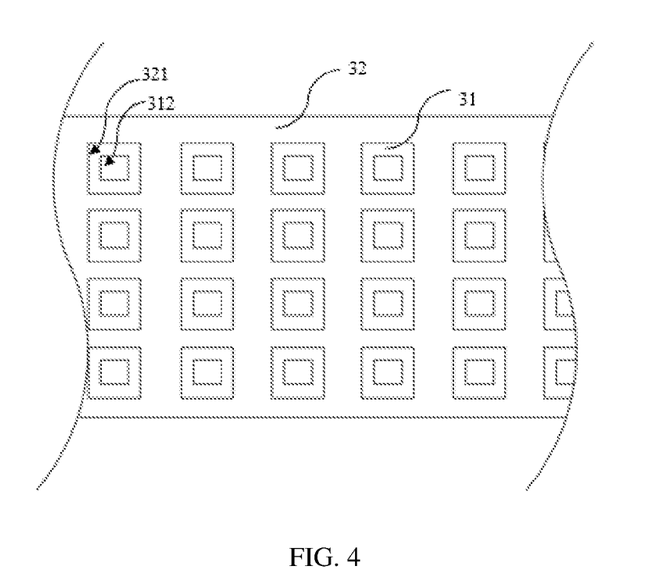
FIG. 4 is a schematic diagram of a buffer layer and a heat dispersion plate of the flexible display device in FIG. 3.

The present disclosure provides a second specific embodiment as shown in FIG. 3 and FIG. 4. A difference between this embodiment and the second specific embodiment is that a plurality of openings 312 are formed on an area of the heat dispersion plate 31 that is directly opposite to the first adhesive layer 4. The openings 312 are formed on the surface of the heat dispersion plate 31 close to the first adhesive layer 4. The surface of the buffer layer 32 close to the heat dispersion plate 31 is provided with a plurality of blind holes 321 corresponding to the openings 312. The blind holes 321 and the openings 312 are arranged in one-to-one correspondence and extend through one another.

Referring to FIG. 4, an orthographic projection of the blind holes 321 on the heat dispersion plate 31 completely covers the openings 312, and an area of the orthographic projection of the blind holes 321 on the heat dispersion plate 31 is larger than an area of the openings 312. To ensure a buffering performance of the buffer layer 32, a depth of the blind hole 321 is less than or equal to half of a thickness of the buffer layer 32.

The first adhesive layer material in the liquid state extends into the blind holes 321 through the openings 312 and fills the blind holes 321 and the openings 312. Since the area of the blind holes 321 is larger than the area of the openings 312, the cured first adhesive layer 4 adaptively forms T-shaped protrusions 41 at positions of the blind holes 321 and the openings 312. A size of a portion of the protrusion 41 in the blind hole 321 is greater than a size of a portion in the opening 312, so that the protrusion 41 in the blind hole 321 is limited by the opening 312. After curing, a stable engaging structure is formed between the first adhesive layer 4 with the heat dispersion plate 31 and the buffer layer 32 through the protrusions 41. At this time, the bonding force between the first adhesive layer 4 and the composite support assembly 3 includes the adhesive force between the first adhesive layer 4 and the heat dispersion plate 31 and the connection force of engaging the first adhesive layer 4 with the heat dispersion plate 31 and the buffer layer 32. The surface of the first adhesive layer 4 close to the heat dispersion plate 31 is engaged with the composite support assembly 3 through the plurality of T-shaped protrusion 41, which can significantly increase the bonding force between the first adhesive layer 4 and the composite support assembly 3, and improve the stability of the connection between the composite support assembly 3 and the second backplane 22.

In some embodiments of the present disclosure, a side length of the opening 312 ranges from 1 mm to 2 mm, and a side length of the blind hole 321 ranges from 2 mm to 3 mm. In order to ensure that the connection force between the first adhesive layer 4 and the composite support assembly 3 is strong enough, the area of the orthographic projection of the blind hole 321 on the heat dispersion plate 31 can be more than twice the area of the opening 312. An area of an orthographic projection of an end of the protrusion 41 protruding from the heat dispersion plate 31 and close to the buffer layer 32 on a plane where the heat dispersion plate 31 is located is larger than or equal to the area of the opening 312.

It can be understood that a sidewall of the opening 312 and/or the blind hole 321 may be inclined, so that a cross-sectional shape of the opening 312 and/or the blind hole 321 is an inverted trapezoid as shown in the recess 311 of FIG. 2. Correspondingly, a cross-sectional shape of a part of the protrusion 41 in the opening 312 and/or the blind hole 321 is also an inverted trapezoid. It can not only increase the contact area between the first adhesive layer 4 and the heat dispersion plate 31, but also further provide the engaging structure between the protrusion 41 and the composite support assembly 3. Therefore, the inclined sidewall of the opening 312 and/or the blind hole 321 can simultaneously increase the adhesive force between the first adhesive layer 4 and the heat dispersion plate 31 and the connection force between the first adhesive layer 4 and the composite support assembly 3, thereby improving the stability of the connection between the composite support assembly 3 and the second backplane 22, and reducing the risk of peeling off the composite support assembly 3.

In other embodiments of the present disclosure, the flexible display device 100 includes the flexible display panel 1, the composite support assembly 3, and the first adhesive layer 4. The composite support assembly 3 includes the buffer layer 32. The buffer layer 32 is adhered to the first adhesive layer 4. Furthermore, the plurality of blind holes are formed on the surface of the buffer layer 32 close to the first adhesive layer 4. The first adhesive layer 4 is provided with the protrusion 41 extending into the composite support assembly 3. The protrusion 41 extends into the blind hole 321 on the buffer layer 32. The protrusion 41 increases the contact area between the first adhesive layer 4 and the composite support assembly 3, thereby increasing the bonding force between the first adhesive layer 4 and the composite support assembly 3. In addition, the sidewall of the blind hole 321 is inclined. The opening area of the blind hole 321 close to the first adhesive layer 4 is smaller than the bottom area of the blind hole 321 away from the first adhesive layer 4, so that the blind hole 321 has an inverted trapezoidal structure. The engaging structure is formed between the cured first adhesive layer 4 and the buffer layer 32, thereby further increasing the bonding force between the first adhesive layer 4 and the composite support assembly 3, and reducing the risk of peeling off the composite support assembly 3.

It is understandable that the flexible display panel 1 may also have various bending angles. The drawings only show the flexible display device in which the first plane section 11 and the second plane section 12 are parallel to each other as an example. In some other embodiments of the present disclosure, an angle between the first plane section 11 and the second plane section 12 may be 60 degrees or 90 degrees, etc., which is not specifically limited here.

The present disclosure also provides a manufacturing method of the aforementioned flexible display device 100, which specifically includes the following steps.

In a step B1, a heat dispersion plate 31 and a buffer layer 32 are provided.

The heat dispersion plate 31 may be a copper sheet. In other embodiments, the heat dispersion plate 31 may also be an aluminum sheet, a stainless steel sheet, a copper-aluminum alloy sheet, or the like. The buffer layer 32 is made of a foam.

In a step B2, a plurality of openings 312 are formed on the heat dispersion plate 31, and a plurality of blind holes 321 are formed on the buffer layer 32 corresponding to the openings 312. An orthographic projection of the blind holes 321 on the heat dispersion plate 31 completely covers the openings 312, and an area of the orthographic projection of the blind holes 321 on the heat dispersion plate 31 is greater than or equal to twice an area of the openings 312.

In a step B3, the heat dispersion plate 31 and the buffer layer 32 obtained in the step B2 are assembled with a grid adhesive 33 to form the composite support assembly 3.

In a step B4, the openings 312 and the blind holes 321 are filled with a first adhesive layer material in a fluid state, and then it is coated with the first adhesive layer material in the fluid state until a first adhesive layer 4 with a target thickness is formed on a surface of the heat dispersion plate 31.

A thickness of a part of the first adhesive layer 4 outside the heat dispersion plate 31 ranges from 50 μm to 150 μm. In some other embodiments, the thickness of the part of the first adhesive layer 4 outside the heat dispersion plate 31 can also range from 50 μm to 80 μm.

The openings 312 and blind holes 321 are filled with the first adhesive layer material in the liquid state. Specifically, the first adhesive layer material in the liquid state can be directly sprayed into the openings 312 and the blind holes 321 by using a nozzle (not shown in the figures). In other embodiments, the surface of the heat dispersion plate 31 with the openings 312 can also be placed upward, so that the first adhesive layer material in the liquid state continuously drips on the heat dispersion plate 31. The first adhesive layer material in the liquid state flows into the openings 312 and the blind holes 321 and gradually fills the openings 312 and the blind holes 321.

In a step B5, the first adhesive layer material in the liquid state is cured to obtain the first adhesive layer 4 with protrusions 41. The protrusions 41 extend into the openings 312 and the blind holes 321.

The cured first adhesive layer 4 forms the T-shaped protrusions 41 at the openings 312 and the blind holes 321. The first adhesive layer 4 is engaged with the composite support assembly 3 by the T-shaped protrusions 41.

If the first adhesive layer 4 is made of an UV adhesive, the curing of the first adhesive layer 4 can be accomplished by ultraviolet light.

In a step B6, the composite support assembly 3 obtained in the step B5 is cut into a size that matches the flexible display panel 1, and the cut composite support assembly 3 is adhered to a first backplane 21.

In a step B7, a surface of the composite support assembly 3 away from the first backplane 21 is adhered and fixed to a second backplane 22 by using the second adhesive layer 5 and the first adhesive layer 4.

It can be understood that the first adhesive layer 4 is adhered and fixed to the heat dispersion plate 31, and an adhesive force between material of the first adhesive layer 4 and the heat dispersion plate 31 is greater than an adhesive force between material of the second adhesive layer 5 and the heat dispersion plate 31. In this way, the problem of insufficient adhesion between the metal heat dissipation layer and the adhesive layer in the prior art can be further solved through a selection of materials.

A surface of the first adhesive layer 4 close to the composite support assembly 3 is adhered and fixed to the heat dispersion plate 31. A surface of the first adhesive layer 4 away from the composite support assembly 3 is adhered and fixed to the second adhesive layer 5. A surface of the second adhesive layer 5 away from the first adhesive layer 4 is adhered and fixed to the second backplane 22. Therefore, the composite support assembly 3 is stably connected to the second backplane 22 through the first adhesive layer 4 and the second adhesive layer 5.

In the present disclosure, the first adhesive layer 4 is disposed between the composite support assembly 3 and the second adhesive layer 5. The first adhesive layer 4 is formed with the protrusions 41 extending into the composite support assembly 3. The structure of the protrusions 41 increases the bonding force between the first adhesive layer 4 and the composite support assembly 3, thereby improving the stability of the connection between the composite support assembly 3 and the second backplane 22, and reducing the risk of peeling off the composite support assembly 3.

The above provides a detailed introduction to the flexible display device and the manufacturing method thereof of the embodiments of the present disclosure. Specific embodiments are used in this article to illustrate principles and implementations of the present disclosure. The description of the above embodiments is only used to help understand methods and core ideas of the present disclosure. For those skilled in the art, based on the ideas of the present disclosure, there will be changes in the specific embodiments and the scope of application. In summary, contents of this specification should not be construed as a restriction on the present disclosure.

What is claimed is:

1. A flexible display device, comprising:
   a flexible display panel, wherein the flexible display panel is bent to form a first plane section, a bending section, and a second plane section, and both ends of the bending section are connected to the first plane section and the second plane section, respectively;
   a composite support assembly disposed between the first plane section and the second plane section; and
   a first adhesive layer, wherein a surface of the first adhesive layer close to the composite support assembly is connected to the composite support assembly, and the first adhesive layer is provided with a protrusion extending into the composite support assembly;
   wherein the composite support assembly further comprises a buffer layer, a blind hole is formed on a surface of the buffer layer close to the first adhesive layer, and the protrusion extends into the blind hole.

2. The flexible display device according to claim 1, further comprising: a second adhesive layer, wherein the second adhesive layer is adhered and fixed to a surface of the first adhesive layer away from the composite support assembly.

3. The flexible display device according to claim 1, wherein the composite support assembly comprises a heat dispersion plate, the heat dispersion plate is provided with an opening, and the protrusion extends through the heat dispersion plate via the opening.

4. The flexible display device according to claim 3, wherein the buffer layer comprises a pore structure, the protrusion extends from the opening into the pore structure of the buffer layer, and the first adhesive layer is engaged with the buffer layer.

5. The flexible display device according to claim 3, wherein a surface of the buffer layer close to the heat dispersion plate is provided with a blind hole corresponding to the opening, and the protrusion extends through the opening to the blind hole.

6. The flexible display device according to claim 5, wherein an orthographic projection of the blind hole on the heat dispersion plate completely covers the opening, and an area of the orthographic projection of the blind hole on the heat dispersion plate is larger than or equal to an area of the opening.

7. The flexible display device according to claim 5, wherein a depth of the blind hole is less than half of a thickness of the buffer layer.

8. The flexible display device according to claim 5, wherein the opening and the blind hole are square, a side length of the opening ranges from 1 mm to 2 mm, and a side length of the blind hole ranges from 2 mm to 3 mm.

9. The flexible display device according to claim 3, wherein a thickness of a part of the first adhesive layer outside the heat dispersion plate ranges from 50 micrometers to 150 micrometers.

10. The flexible display device according to claim 4, wherein material of the buffer layer comprises a foam with the pore structure.

11. The flexible display device according to claim 1, wherein a side wall of the blind hole is inclined, and an opening area of the blind hole close to the first adhesive layer is smaller than a bottom area of the blind hole away from the first adhesive layer.

12. The flexible display device according to claim 1, wherein the first adhesive layer is in a liquid state with good fluidity when heated or before photocuring; and the first adhesive layer is in a solid state at a room temperature or after photocuring.

13. The flexible display device according to claim 2, wherein the first adhesive layer is an ultraviolet (UV) adhesive or a Taffeta adhesive, and the second adhesive layer is a double-sided adhesive.

14. The flexible display device according to claim 1, wherein the protrusion is engaged with the composite support assembly.

15. The flexible display device according to claim 1, wherein the composite support assembly comprises a heat dispersion plate, the heat dispersion plate is provided with an opening, the protrusion extends through the heat dispersion plate via the opening, and a side wall of the opening is inclined.

16. A flexible display device, comprising:
a flexible display panel, wherein the flexible display panel is bent to form a first plane section, a bending section, and a second plane section, and both ends of the bending section are connected to the first plane section and the second plane section, respectively;
a composite support assembly disposed between the first plane section and the second plane section, wherein the composite support assembly comprises a heat dispersion plate and a buffer layer, the heat dispersion plate is provided with an opening, a surface of the buffer layer close to the heat dispersion plate is provided with a blind hole corresponding to the opening, an orthographic projection of the blind hole on the heat dispersion plate completely covers the opening, and an area of the orthographic projection of the blind hole on the heat dispersion plate is larger than or equal to an area of the opening;
a first adhesive layer disposed on the heat dispersion plate, wherein the first adhesive layer is formed with a protrusion that extends through and fills the opening and the blind hole, and the first adhesive layer is engaged with the composite support assembly through the protrusion; and
a second adhesive layer, wherein the second adhesive layer is adhered and fixed to a surface of the first adhesive layer away from the heat dispersion plate.

17. A manufacturing method of the flexible display device as claimed in claim 16, comprising:
B1, providing the heat dispersion plate and the buffer layer;
B2, forming a plurality of the openings on the heat dispersion plate of the composite support assembly, and forming a plurality of the blind holes on the buffer layer of the composite support assembly corresponding to the openings, wherein an orthographic projection of the blind holes on the heat dispersion plate completely covers the openings, and an area of the orthographic projection of the blind holes on the heat dispersion plate is larger than or equal to twice an area of the openings;
B3, assembling the heat dispersion plate and the buffer layer obtained in the step B2 with a grid adhesive to form the composite support assembly;
B4, filling the openings and the blind holes with a first adhesive layer material in a fluid state, and then coating with the first adhesive layer material in the fluid state until the first adhesive layer with a target thickness is formed on a surface of the heat dispersion plate;
B5, curing the first adhesive layer material to obtain the first adhesive layer with a plurality of the protrusions, wherein the protrusions extend into the openings and the blind holes; and
wherein a bonding force between the first adhesive layer and the heat dispersion plate comprises an adhesive force between the first adhesive layer and the heat dispersion plate and a connection force of engaging the first adhesive layer with the composite support assembly;
B6, cutting the composite support assembly obtained in the step B5 into a size that matches the flexible display panel, and adhering the cut composite support assembly to a first backplane; and
B7, adhering and fixing a surface of the composite support assembly away from the first backplane to a second backplane by using the second adhesive layer and the first adhesive layer,
wherein the first adhesive layer is adhered and fixed to the heat dispersion plate, and an adhesive force between the first adhesive layer material and the heat dispersion plate is greater than an adhesive force between material of the second adhesive layer and the heat dispersion plate.

\* \* \* \* \*